(12) United States Patent
Rogers et al.

(10) Patent No.: US 11,115,030 B2
(45) Date of Patent: *Sep. 7, 2021

(54) METHOD AND CIRCUITS FOR CHARGE PUMP DEVICES OF PHASE-LOCKED LOOPS

(71) Applicant: Analog Bits Inc., Sunnyvale, CA (US)

(72) Inventors: Alan C. Rogers, Palo Alto, CA (US); Raghunand Bhagwan, Sunnyvale, CA (US)

(73) Assignee: Analog Bits Inc., Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/248,951

(22) Filed: Jan. 16, 2019

(65) Prior Publication Data

US 2019/0222216 A1 Jul. 18, 2019

Related U.S. Application Data

(63) Continuation of application No. 15/392,474, filed on Dec. 28, 2016, now Pat. No. 10,193,560.

(51) Int. Cl.
*H03L 7/089* (2006.01)

(52) U.S. Cl.
CPC .......... *H03L 7/0891* (2013.01); *H03L 7/0896* (2013.01)

(58) Field of Classification Search
CPC ... H03L 7/0891; H03L 7/0896; H03L 7/0898; H03L 7/0893
See application file for complete search history.

(56) References Cited

U.S. PATENT DOCUMENTS

| | | | |
|---|---|---|---|
| 5,012,494 | A | 4/1991 | Lai et al. |
| 5,126,692 | A | 6/1992 | Shearer et al. |

(Continued)

FOREIGN PATENT DOCUMENTS

| | | |
|---|---|---|
| CN | 1691512 | 11/2005 |
| CN | 104601168 | 5/2015 |

(Continued)

OTHER PUBLICATIONS

International Search Report and Written Opinion in International Application No. PCT/US2017/066341, dated Apr. 18, 2018, 11 pages.

(Continued)

*Primary Examiner* — Patrick C Chen
(74) *Attorney, Agent, or Firm* — Fish & Richardson P.C.

(57) ABSTRACT

A charge pump includes: (I) a current source; (II) a p-channel source current network including: a first p-channel transistor; a second p-channel transistor; a p-channel current switch including at least one source terminal coupled to the drain terminal of the first p-channel transistor, at least one gate coupled to a phase comparator, and at least one drain terminal; a third p-channel transistor; and (III) a n-channel sink current network including: a first n-channel transistor; a second n-channel transistor; a third n-channel transistor; a n-channel current switch comprising at least one drain terminal coupled to the source terminal of the third n-channel transistor, at least one gate coupled to the phase comparator; and at least one source terminal coupled to the drain terminal of the first n-channel transistor; and wherein the p-channel source current network and the n-channel sink current network draw a baseline current from the first p-channel transistor.

20 Claims, 7 Drawing Sheets

IMPLEMENTATION 1

(56) References Cited

U.S. PATENT DOCUMENTS

| | | |
|---|---|---|
| 5,144,156 A | 9/1992 | Kawasaki |
| 5,165,054 A | 11/1992 | Platt et al. |
| 5,646,563 A | 7/1997 | Kuo |
| 5,825,640 A | 10/1998 | Quigley et al. |
| 6,052,015 A | 4/2000 | Desbonnets |
| 6,064,250 A | 5/2000 | Proebsting |
| 6,118,346 A | 9/2000 | Olgaard |
| 6,124,741 A | 9/2000 | Arcus |
| 6,278,332 B1 | 8/2001 | Nelson et al. |
| 6,316,977 B1 | 11/2001 | Sargeant |
| 6,326,852 B1 | 12/2001 | Wakayama |
| 6,661,683 B2 | 12/2003 | Botker et al. |
| 6,744,292 B2 * | 6/2004 | Chen .............. H03L 7/0893 327/148 |
| 6,885,251 B2 | 4/2005 | Delmot et al. |
| 7,012,473 B1 | 3/2006 | Kokolakis |
| 7,135,900 B2 | 11/2006 | Sohn |
| 7,183,822 B1 | 2/2007 | Bolton et al. |
| 7,492,196 B2 | 2/2009 | Lever |
| 7,888,980 B2 | 2/2011 | Li et al. |
| 7,902,888 B1 | 3/2011 | Mei et al. |
| 8,193,843 B1 | 6/2012 | Stegmeir |
| 8,294,497 B2 * | 10/2012 | Jeffries ............ H03K 5/1565 327/148 |
| 9,024,667 B1 | 5/2015 | Fu |
| 2002/0105388 A1 | 8/2002 | Delmot et al. |
| 2002/0140469 A1 | 10/2002 | Lever |
| 2003/0048126 A1 | 3/2003 | Watarai |
| 2005/0068090 A1 | 3/2005 | Chen et al. |
| 2007/0272923 A1 | 11/2007 | Lee |
| 2008/0231346 A1 * | 9/2008 | Hung .................. H02M 3/07 327/536 |
| 2009/0121759 A1 | 5/2009 | Wang et al. |
| 2013/0099852 A1 | 4/2013 | Chen et al. |
| 2016/0164405 A1 * | 6/2016 | Ravinuthula .......... H03L 7/085 327/157 |
| 2016/0233764 A1 | 8/2016 | Park et al. |
| 2018/0183446 A1 | 6/2018 | Rogers et al. |

FOREIGN PATENT DOCUMENTS

| | | |
|---|---|---|
| GB | 2120478 | 11/1983 |
| JP | 2010-226556 | 10/2010 |

OTHER PUBLICATIONS

CN Office Action in Chinese Application No. 201780086190.5 dated Feb. 27, 2020, 6 pages (with English Search Report).
Extended European Search Report in EP Appln. No. 17888813.7 dated Nov. 22, 2019, 10 pages.
Speeti et Al., "Charge-pump PLL, with SC-loop filter for low frequency reference signal." IEEE 2008 11th International Biennial Baltic Electronics Conference, Oct. 2008, 115-8.

\* cited by examiner

CHARGE PUMP

IMPLEMENTATION 1

IMPLEMENTATION 2

IMPLEMENTATION 3

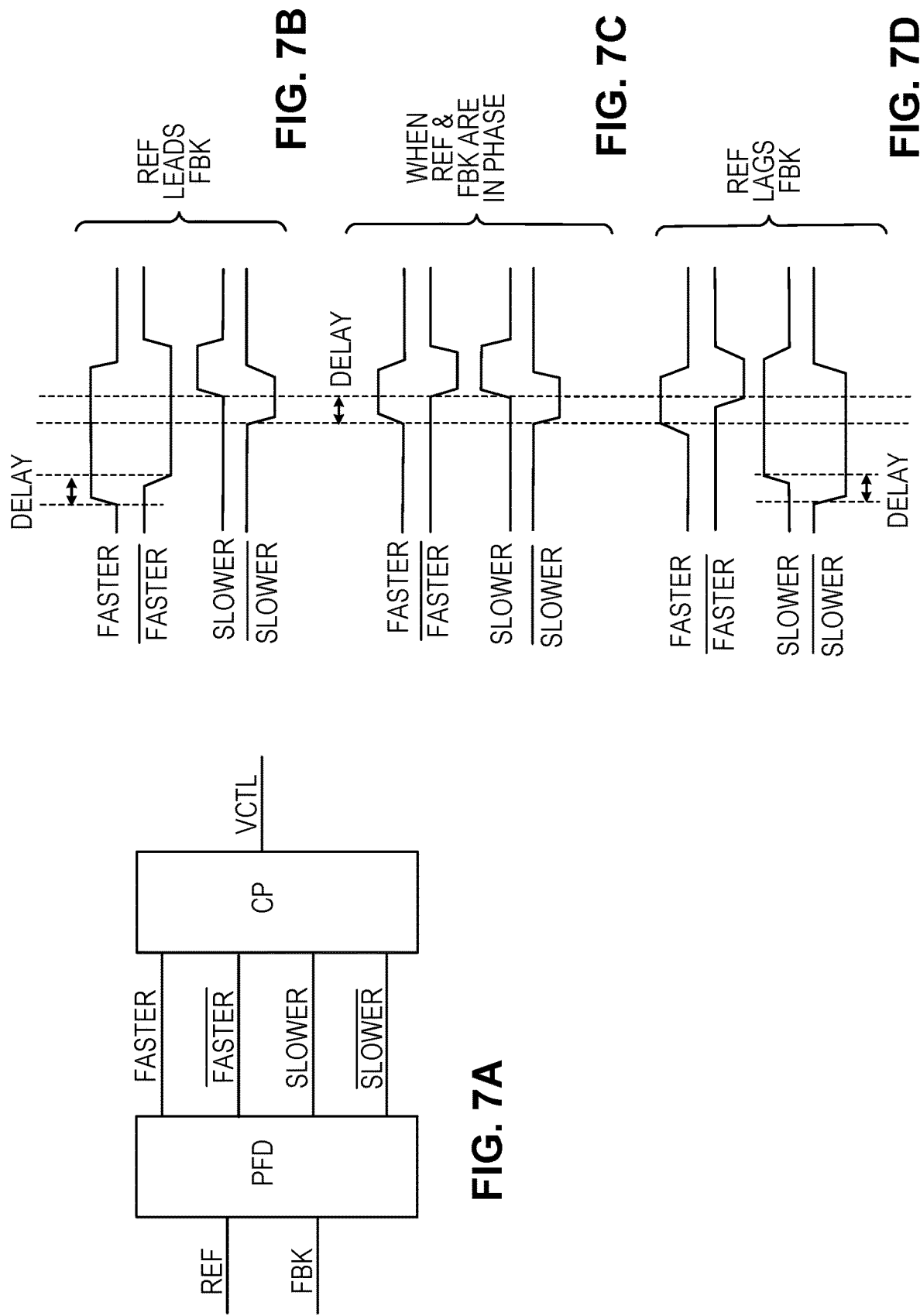

METHOD AND CIRCUITS FOR CHARGE PUMP DEVICES OF PHASE-LOCKED LOOPS

CROSS-REFERENCE TO RELATED APPLICATION

This application is a continuation of U.S. application Ser. No. 15/392,474, filed Dec. 28, 2016, the contents of which are incorporated by reference herein.

TECHNICAL FIELD

The disclosure generally relates to phase-lock loops (PLL) and in particular to circuits for a charge pump (CP) device.

BACKGROUND

Phase-locked loops (PLLs) are widely used in, for example, communications for coherent carrier tracking and threshold extension, bit synchronization, as well as symbol synchronization. Phase-locked loop (PLL) is an electronic circuit that controls an oscillator so that it maintains a constant phase relationship relative to an input reference signal. Generally, maintaining a constant phase relationship is otherwise referred to by stating that "the oscillator is in lock with" or "is locked to" the input reference signal.

SUMMARY

In one aspect, some implementations provide a charge pump configured to receive a first p-bias input, a second p-bias input, a first n-bias input, a second n-bias input; and generate a voltage output on an output line, the charge pump including: (I) a current source; (II) a p-channel source current network including: a first p-channel transistor including a source terminal coupled to the current source, a gate configured to receive the first p-bias input, and a drain terminal; a second p-channel transistor comprising a source terminal coupled to the drain terminal of the first p-channel transistor, a gate configured to receive the second p-bias input, and a drain terminal; a p-channel current switch including at least one source terminal coupled to the drain terminal of the first p-channel transistor, at least one gate coupled to a phase comparator, and at least one drain terminal; a third p-channel transistor including a source terminal coupled to a drain terminal of the p-channel current switch, a gate configured to receive the second p-bias input, and a drain terminal coupled to the output line; and (III) a n-channel sink current network including: a first n-channel transistor including a drain terminal, a gate configured to receive the first n-bias input, and a source terminal coupled to the ground, a second n-channel transistor including a drain terminal coupled to the source terminal of the second p-channel transistor, a gate configured to receive the second n-bias input, and a source terminal coupled to the drain terminal of the first n-channel transistor; a third n-channel transistor comprising a drain terminal coupled to the drain terminal of the third p-channel transistor as well as the output of the charge pump, a gate configured to receive the second n-bias input, and a source terminal, a n-channel current switch comprising at least one drain terminal coupled to the source terminal of the third n-channel transistor, at least one gate coupled to the phase comparator, and at least one source terminal coupled to the drain terminal of the first n-channel transistor; and wherein the p-channel source current network and the n-channel sink current network are configured to draw a baseline current from the first p-channel transistor and channel the baseline current through the second p-channel transistor to the second n-channel transistor such that (i) when the p-channel current switch is on, a first increment of current—smaller than the baseline current—is drawn from the first p-channel transistor and subsequently flown through the p-channel current switch and the third p-channel transistor to the output line, and (ii) when the n-channel switch is on, a second increment of current—smaller than the baseline current—is drawn from the output line and subsequently flown from the third n-channel transistor through the n-channel current switch to the first n-channel transistor.

Implementations may include one or more of the following features.

The p-channel current switch may include a first p-channel current switch transistor comprising a first source terminal coupled to the drain terminal of the first p-channel transistor, a gate configured to receive a negated first output from the phase comparator, and a first drain terminal coupled to the source terminal of the third p-channel transistor; and a second p-channel current switch transistor configured to capacitively couple a first output of the phase comparator to the source terminal of the third p-channel transistor, the second p-channel current switch transistor comprising a gate configured to receive the first output from the phase comparator, a second source terminal and a second drain terminal, both coupled to the source terminal of the third p-channel transistor.

The first output from the phase comparator may indicate whether a reference signal leads a feedback signal, and wherein the negated first output lags behind the first output signal.

The n-channel current switch may include: a first n-channel current switch transistor including a first drain terminal coupled to the source terminal of the third n-channel transistor, a gate configured to receive a second output from the phase comparator, and a first source terminal coupled to the drain terminal of the first n-channel transistor; and a second n-channel current switch transistor configured to capacitively couple to the phase comparator to the source terminal the third n-channel transistor, the second n-channel current switch transistor comprising a gate configured to receive a negated second output from the phase comparator, a second drain terminal and a second source terminal, both coupled to the drain terminal of the third p-channel transistor.

The second output from the phase comparator may indicate whether a feedback signal leads a reference signal, and the negated second output lags behind the second output signal.

The second p-channel transistor may be sized to conduct M times as much current as the p-channel current switch, wherein the second n-channel transistor is sized to conduct M times as much current as the n-channel current switch, and wherein M is larger than one. The first p-channel transistor may be sized to conduct current sufficient for the second p-channel transistor as well as the p-channel current switch when the p-channel current switch is turned on. The first n-channel transistor may be sized to conduct current sufficient for the second n-channel transistor as well as the n-channel current switch when the n-channel current switch is turned on.

The p-channel source current network may include a fourth p-channel transistor including a source terminal coupled to the at least one drain terminal of the p-channel current switch, a gate configured to receive the second p-bias input, and a drain terminal; and wherein the n-channel sink current network may include a fourth n-channel transistor including a drain terminal coupled to the drain terminal of the fourth p-channel transistor, a gate configured to receive a second n-bias input, and a source terminal coupled to the at least one drain terminal of the n-channel current switch.

The fourth p-channel transistor may be sized to conduct N times as much current as the p-channel current switch, wherein the fourth n-channel transistor may be sized to conduct N times as much current as the n-channel current switch, and wherein N is larger than one.

The voltage output may be coupled to a Voltage Controlled Oscillator (VCO).

The charge pump may include a voltage buffer disposed on a path of the baseline current and connected to the second p-channel transistor as well as the second n-channel transistor, the voltage buffer configured to source and sink currents on the path of the baseline current while generating an output voltage nominally equal to the output voltage of the charge pump. The voltage buffer may include an operation amplifier and a capacitor coupled to an output of the operation amplifier.

In another aspect, some implementations provide a charge pump configured to receive a first p-bias input, a second p-bias input, a first n-bias input, a second n-bias input; and generate a voltage output on an output line, the charge pump including: (I) a current source; (II) a p-channel source current network that includes: a first p-channel transistor including a source terminal coupled to the current source, a gate configured to receive the first p-bias input, and a drain terminal; a second p-channel transistor including a source terminal, a gate configured to receive the second p-bias input, and a drain terminal; a third p-channel transistor including a source terminal, a gate configured to receive the second p-bias input, and a drain terminal coupled to the output line; a p-channel current switch including at least one source terminal coupled to the drain terminal of the first p-channel transistor, at least one gate coupled to a phase comparator, and at least one drain terminal coupled to the source terminal of the second p-channel transistor as well as the source terminal of the third p-channel transistor; and (III) a n-channel sink current network including: a first n-channel transistor comprising a drain terminal, a gate configured to receive the first n-bias input, and a source terminal; a second n-channel transistor including a drain terminal coupled to the drain terminal of the second p-channel transistor, a gate configured to receive the second n-bias input, and a source terminal; a third n-channel transistor including a drain terminal coupled to the drain terminal of the third p-channel transistor as well as the output of the charge pump, a gate configured to receive the second n-bias input, and a source terminal, a n-channel current switch including at least one drain terminal coupled to the source terminal of the third n-channel transistor as well as the source terminal of the second n-channel transistor, at least one gate coupled to the phase comparator, and at least one source terminal coupled to the drain terminal of the first n-channel transistor; and wherein the p-channel source current network is configured to draw a current, when the p-channel switch is on, from the first p-channel transistor and split the current between a first path from the second p-channel transistor to the second n-channel transistor and a second path through the third p-channel transistor such that the split current on the first path is larger than the split current on the second path.

Implementations may include one or more of the following features.

The p-channel current switch may include: a first p-channel current switch transistor including a first source terminal coupled to the drain terminal of the first p-channel transistor, a gate configured to receive a negated first output from the phase comparator, and a first drain terminal; and a second p-channel current switch transistor capacitively coupling to the phase comparator to the source terminal of the third p-channel transistor, the second p-channel current switch transistor comprising a gate configured to receive the first output from the phase comparator, a second source terminal and a second drain terminal, both coupled to the source terminal of the third p-channel transistor.

The first output from the phase comparator may indicate whether a reference signal leads a feedback signal, and wherein the negated first output lags behind the first output signal. The n-channel current switch may include: a first n-channel current switch transistor including a first drain terminal coupled to the source terminal of the third n-channel transistor, a gate configured to receive a second output from the phase comparator, and a first source terminal coupled to the drain terminal of the first n-channel transistor; and a second n-channel current switch transistor capacitively coupling the phase comparator to the drain terminal of the third n-channel transistor, the second n-channel current switch transistor comprising a gate configured to receive the negated second output from the phase comparator, a second drain terminal and a second source terminal, both coupled to the source terminal of the third n-channel transistor.

The second output from the phase comparator indicates whether a feedback signal leads a reference signal, and wherein the negated second output lags behind the second output signal. The split current on the first path is N times the split current on the second path, and wherein N is larger than 1. The first p-channel transistor is sized to conduct current sufficient for the second p-channel transistor as well as the p-channel current switch when the p-channel current switch is turned on. The first n-channel transistor is sized to conduct current sufficient for the second n-channel transistor as well as the n-channel current switch when the n-channel current switch is turned on.

The p-channel source current network may include a fourth p-channel transistor including a source terminal coupled to the drain terminal of the first p-channel transistor, a gate configured to receive the second p-bias input, and a drain terminal. The n-channel sink current network may include a fourth n-channel transistor including a drain terminal coupled to the drain terminal of the fourth p-channel transistor, a gate configured to receive a second n-bias input, and a source terminal coupled to the drain terminal of the first n-channel transistor.

The fourth p-channel transistor may be sized to conduct M times as much current as the p-channel current switch, wherein the fourth n-channel transistor may be sized to conduct M times as much current as the n-channel current switch, and wherein M is larger than one.

The p-channel source current network and the n-channel sink current network may be configured to draw a baseline current from the first p-channel transistor and channel the baseline current through the second p-channel transistor to the second n-channel transistor regardless of conducting states of the p-channel current switch and the n-channel current switch such that when the p-channel current switch is on, the current—smaller than the baseline current—is drawn from the first p-channel transistor and subsequently flown through the p-channel current switch and the third p-channel transistor to the output line. The voltage output may be coupled to a Voltage Controlled Oscillator (VCO).

The charge pump of claim 14, may include a voltage buffer disposed on the first path and connected to the second p-channel transistor as well as the second n-channel transistor, the voltage buffer configured to source and sink currents on the first path while generating an output voltage nominally equal to the output voltage of the charge pump. The voltage buffer may include an operation amplifier and a capacitor coupled to an output of the operation amplifier.

The details of one or more embodiments are set forth in the accompanying drawings and the description below. Other aspects, features, and advantages will become apparent from the description, the drawings, and the claims.

DESCRIPTION OF DRAWINGS

FIGS. 7A-7D show examples of timing sequences of various signals for operating the chare pump device.

Like reference symbols in the various drawings indicate like elements.

DETAILED DESCRIPTION

Figure 1:
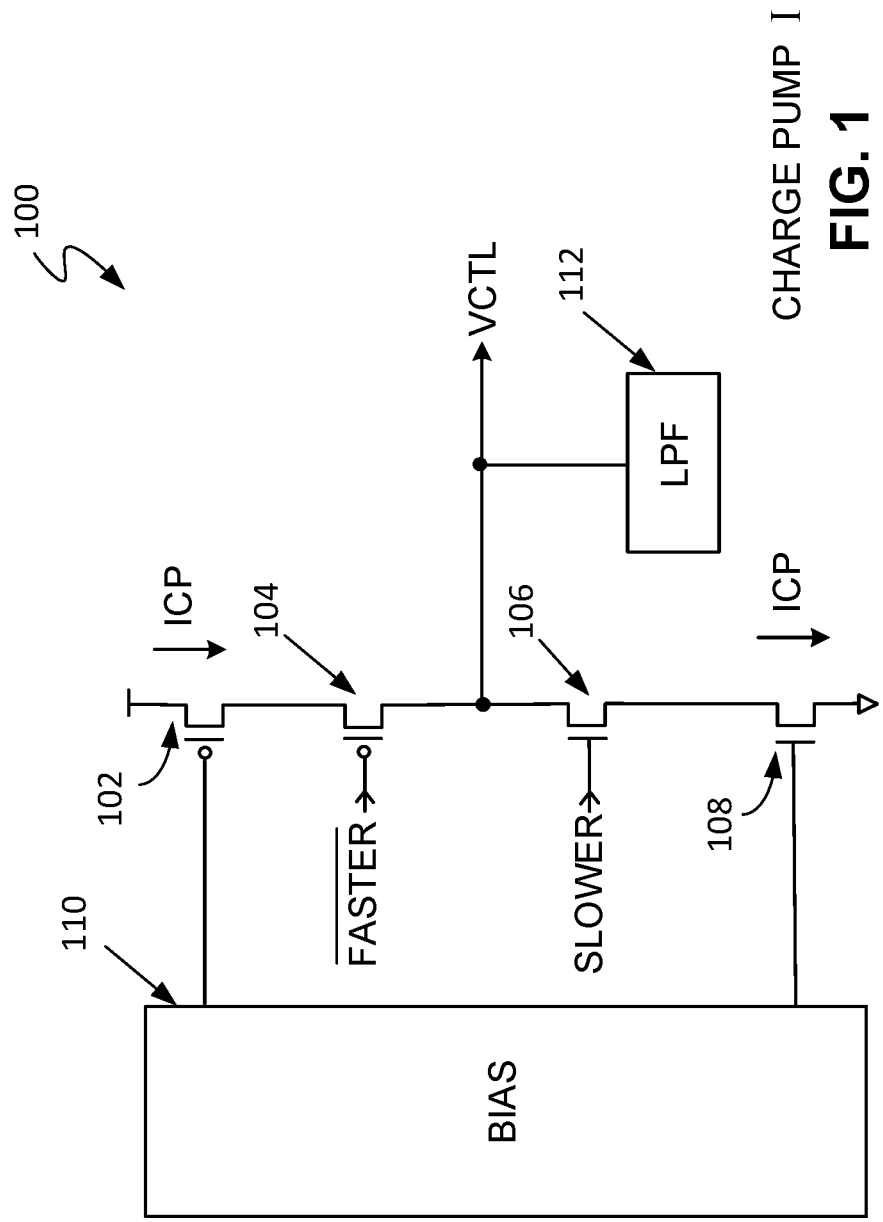
FIG. 1 is a block diagram showing an example of a charge pump device.

Charge pumps are used in PLLs to convert digital signal outputs of the phase detector (PD) or frequency detector (FD) or phase and frequency detector (PFD) into an analog electronic charge, which can then be further processed to 'lock' the phase and or frequency of a voltage controlled oscillator (VCO) output to an input reference. Charge pumps can generally be considered as current switches that source or sink a known current for a duration of time into the low pass filter (LPF) depending on signals output from the PD/FD/PFD. Here, source is used to mean to inject electric charge into the load (LPF) and sink is used to mean to eject electric charge out of the load. In the case of a PFD, and when the PLL is in lock or very close to lock, the PFD outputs are proportional (or equal) to the phase difference or phase error between the PFD input signals. A known current sourced/sunk for a time equal or proportional to the phase error will result in a quantity of charge sourced/sunk proportional to the phase error.

The switching mechanism of currents may give rise to a variety of imperfections. For example, when sourcing 100 uA of current for time period of 10 ps, which equals sourcing of 1 fC of electronic charge, practical limitations can cause the actual charge sourced to deviate from expected 1 fC. The deviation may lead to deteriorations in PLL performance including, for example, worsened static phase error (SPE) when PLL is locked, worsened deterministic jitter at the PLL output, and worsened reference spur pass through to the PLL output. These analog imperfections can arise from a variety of sources including, for example, mismatch of charge coupling and channel charge dispersion of the switching devices.

The amount of charge coupling through the switches and channel charge dispersion depends significantly on the size of the switches. It is beneficial to have the dimensions of the switching devices smaller rather than larger so as to reduce sources of noise—all other things being equal. However, there is a finite size limitation for the current switchers imposed by the manufacturing process. Some implementations strive to advantageously utilize the switch by switching more current (signal) as this operative aspect will lead to a better SNR than when the switch handles less current. In these implementations, the noise (e.g., parasitic coupling and channel charge dispersion) would be constant and irrespective of current switched. In these cases, the noise may depend solely on the size and dimensions of the switchers. For illustration, when switching 100 uA of current for 10 ps, the signal would be 1 fC of charge. Assuming charge coupling is 10 aC, the SNR would, in this case, be 1 fC/10 aC—that is—100. On the other hand, when switching 1 uA of current for 10 ps, the signal would be 10 aC of charge and the SNR would be approximately 1, worsening by a factor of about 100 from earlier case.

Indeed, better SNR can be obtained in some implementations by carrying more current through the switchers. But, with more current (ICP), other PLL component parameters may need to be adjusted to maintain PLL loop dynamics. PLL loop dynamics would include closed loop bandwidth ($\omega_{3db}$), damping factor ($\zeta$), phase margin and such. An increase in ICP could lead to an increase in filter capacitor values to maintain PLL loop dynamics. Filter capacitor is normally the largest area component of a PLL. Increasing area of the capacitor can be disadvantageous. To be fair, ICP may not be arbitrarily reduced to because SNR performance will drop at lower currents as described previously. Some implementations in this disclosure document methods and systems for the charge pump to output smaller currents while maintaining the higher SNR associated with switching larger currents.

FIG. 1 is a block diagram showing an example of a charge pump device 100. In this example, p-channel transistor 102 acts as a current source, with its gate terminal coupled to an output from bias network 110, and its drain terminal coupled to the source terminal of p-channel switch 104. The p-channel switch 104 has a gate configured to receive the $\overline{\text{FASTER}}$ input. The drain terminal of p-channel switch 104 may be coupled to output line VCTL. LPF 112 represents a low-pass filter that generally removes high frequency components on the output line. When $\overline{\text{FASTER}}$ input goes to logic level 0, it enables p-channel switch 104 to conduct current from current source 102, When SLOWER goes to logic level 1 it enables n-channel switch 106 to conduct current from current sink 108 such ICP may flow into or out of output line VCTL.

The drain terminal of n-channel switch 106 is coupled to the output line VCTL and the drain terminal of p-channel switch 104. The gate terminal of n-channel switch 106 is configured to receive SLOWER input. The source terminal of n-channel switch 106 is coupled to the drain terminal of n-channel transistor 108. The gate of n-channel transistor 108 is coupled to an output from BIAS network 110. A source terminal of n-channel transistor 108 is coupled to the ground. When SLOWER input enables n-channel switch 106, current ICP may be drawn from output line VCTL and may flow through n-channel transistor 108 to ground. The bias network is configured such that the current ICP through source 102 is equal to current through sink 108.

Figure 2:
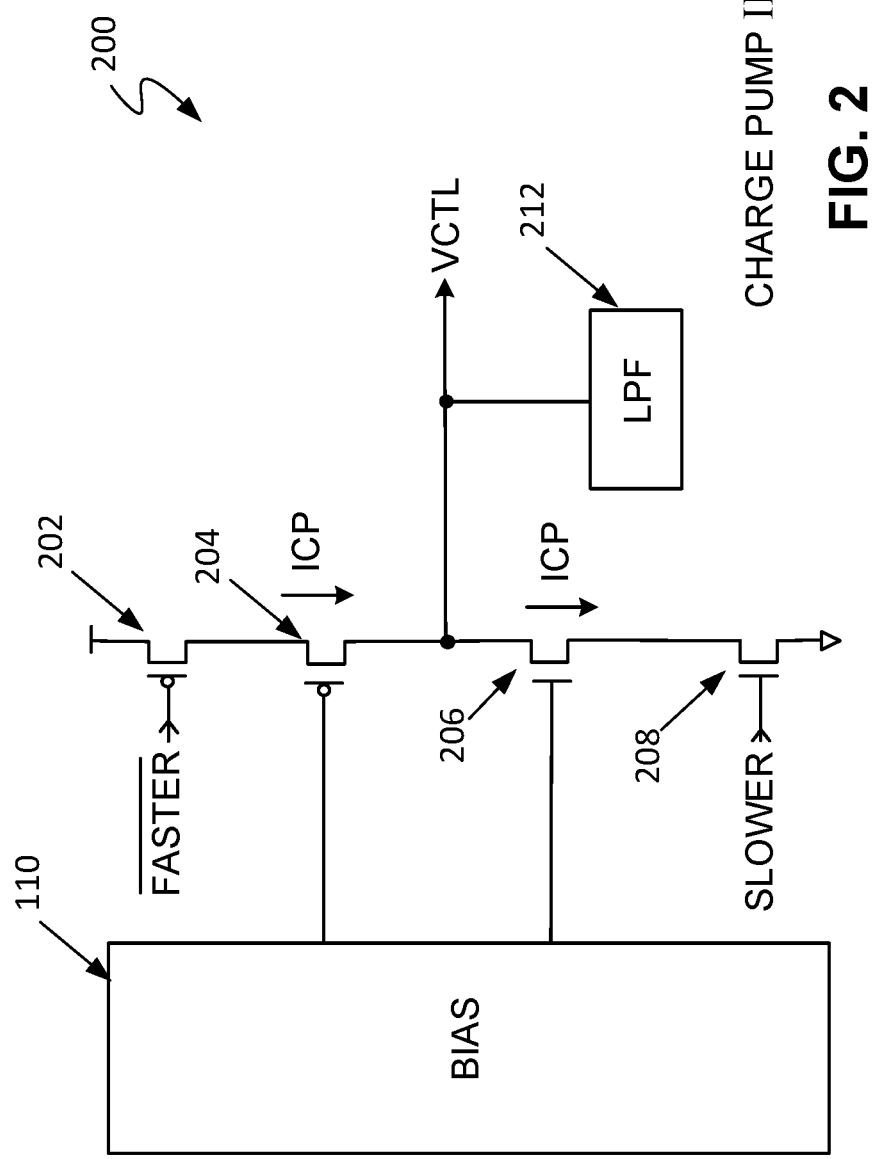
FIG. 2 is a block diagram showing another example of a charge pump device.

FIG. 2 is a block diagram showing another example of a charge pump device 200. In this example, p-channel switch 202 has a drain terminal coupled to the current source 204. The p-channel switch 202 has a gate configured to receive the FASTER input. The drain terminal of p-channel switch 202 may be coupled to the source terminal of p-channel transistor 204. The p-transistor 204 has a gate terminal coupled to an output from bias network 110. The p-transistor 204 also has a drain terminal coupled to the output line for VCTL. LPF 212 represents a low-pass filter that generally removes high frequency components on the output line. When $\overline{\text{FASTER}}$ input enables p-channel switch 202, current will be sourced into the line VCTL. When SLOWER input enables n-channel switch 208 current will be sunk from the output line VCTL.

The drain terminal of n-channel transistor 206 is coupled to the output line VCTL and the drain terminal of p-channel transistor 204. The gate of n-channel transistor 206 is coupled to an output from BIAS network 110. The source terminal of n-channel transistor 206 is coupled to the drain terminal of n-channel switch 208. A gate of n-channel switch 208 is configured to receive SLOWER input. A source terminal of n-channel switch 208 is coupled to the ground. When SLOWER input enables n-channel switch 208, current ICP may be drawn from output line VCTL and may flow through n-channel transistor 206 to ground. The bias network is configured such that the current ICP through source 202 is equal to current through sink 208.

Figure 3:
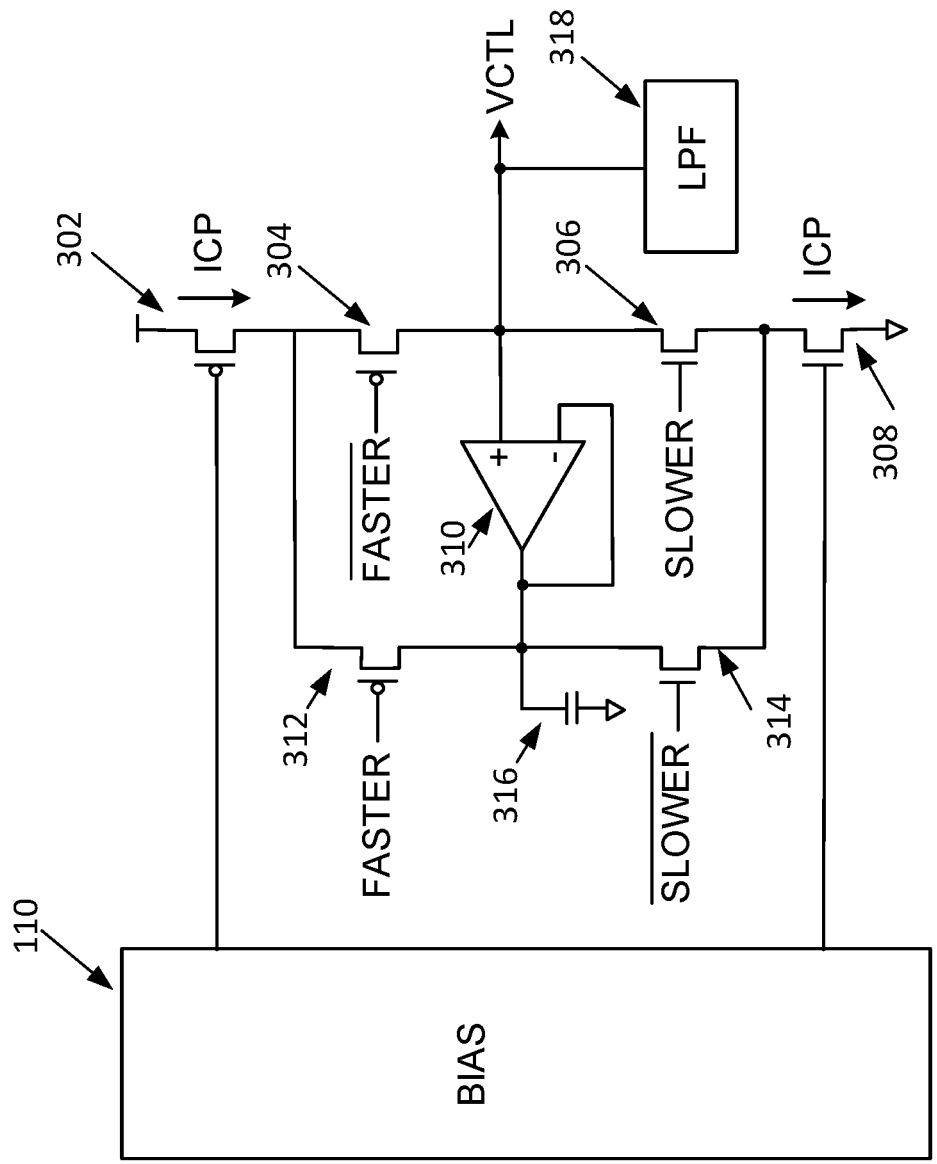
FIG. 3 is a block diagram of yet another example of a charge pump device.

FIG. 3 is a block diagram of yet another example of a charge pump device 300. In this example, p-channel transistor 302 acting as the current source has a source terminal coupled to a power supply, a gate terminal coupled to an output from bias network 110, and a drain terminal coupled to the source terminals of p-channel switch 304 and p-channel switch 312. The p-channel switch 304 has a gate configured to receive the $\overline{\text{FASTER}}$ input, while the p-channel switch 312 has a gate configured to receive the FASTER input. The drain terminal of p-channel switch 304 may be coupled to output line VCTL. The drain terminal of p-channel switch 312 is coupled to the output of buffer 310. Buffer 310 is configured as a unity gain buffer with a positive input from the output line VCTL, such that the output of buffer is nominally equal in voltage to VCTL. The buffer output is coupled to capacitor 316 and the second terminal of the capacitor may be connected to ground. LPF 318 represents a low-pass filter that generally removes high frequency components on the output line. When $\overline{\text{FASTER}}$ input enables p-channel switch 304, FASTER input disables p-channel switch 312 such that ICP may flow towards output line VCTL rather than the combination of capacitor 316 and buffer 310. FASTER and $\overline{\text{FASTER}}$ signals generally arrive at the same point in time.

The drain terminal of n-channel switch 306 is coupled to the output line VCTL and the drain terminal of p-channel switch 304. The gate of n-channel switch 306 is configured to receive the SLOWER input. The source terminal of n-channel switch 306 is coupled to the drain terminal of n-channel transistor 308, the current sink. The output line VCTL is also coupled to a positive input of buffer 310 which has an output coupled to the drain terminal of n-channel switch 314. The gate of n-channel switch 314 is configured to receive the $\overline{\text{SLOWER}}$ input. N-channel switch 314 has a source terminal coupled to the drain terminal of n-channel transistor 308. A gate of n-channel transistor 308 is coupled to an output from BIAS network 110. A source terminal of n-channel transistor 308 is coupled to the ground. When the SLOWER input enables n-channel switch 306, $\overline{\text{SLOWER}}$ disables n-channel switch 314, current ICP may be drawn from output line VCTL and may flow through n-channel transistor 308 coupled to ground. The SLOWER and $\overline{\text{SLOWER}}$ signals generally arrive at the same point in time. The bias network is configured such that the current ICP through source 302 is equal to current through sink 308.

Figure 4:
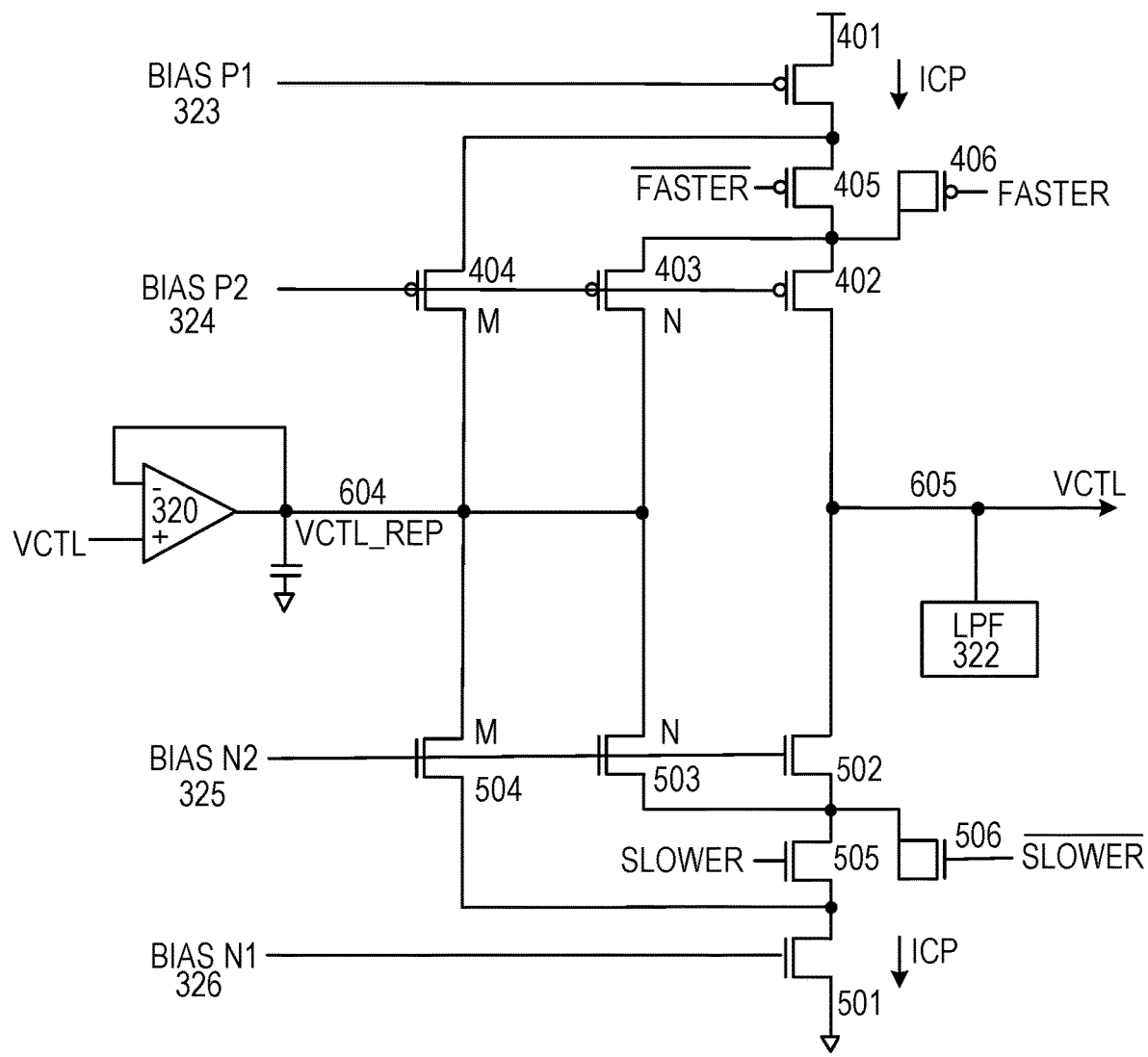
FIG. 4 illustrates an example of a charge pump device with enhanced signal-to-noise ratio (SNR).

FIG. 4 illustrates an example of a charge pump device with enhanced signal-to-noise ratio (SNR). In this example, p-channel transistor 401 to 404 form the source current network while n-channel transistors 501 to 504 form the sink current network. P-channel transistor 401 has source terminal coupled to the current supply. P-channel transistor 401 operates under bias voltage 323. P-channel transistor 401 has a drain terminal coupled to the source terminals of p-channel transistors 402 through 404. The current through current source p-channel transistor 401 may be split over a first path over p-channel transistor 404 and a second path over p-channel current switch transistor 405. The second path flows may in turn split and travel through both p-channel transistor 403 and p-channel transistor 402. A larger portion may flow over p-channel transistor 404 than through p-channel transistor 402, for example, in the ratio of M over 1, where M may represent the size ratio of p-channel transistor 404 over p-channel transistor 402. Likewise, a larger portion may flow over p-channel transistor 403 than through p-channel transistor 402, for example, in the ratio of N over 1, where N may represent the size ratio of p-channel transistor 403 over p-channel transistor 402. Although M may be less than N+1, it may be advantageous for M to be larger than N+1 so that a larger portion of current flows on the first path than on the second path.

In more detail, the source terminal of p-channel transistor 404 is coupled to the drain terminal of p-channel transistor 401. P-channel transistor 404 operates under bias voltage 324. P-channel transistor 404 also has a drain terminal coupled to an output of operational amplifier 320. Operational amplifier 320 acts as an analog buffer. It controls the voltage at node 604 (VCTL_REP) to be substantially identical to that of node 605 (VCTL). This voltage equalization helps maintain the drain nodes of transistors 401/501 to be substantially unaltered during current OFF and current SOURCE/SINK operations. It also helps to release sink/source currents from transistors 403/503 when $\overline{\text{FASTER}}$ and/or SLOWER are ON. In some instances, a capacitor is coupled to the output of the operational amplifier 320. In these instances, the operational amplifier 320 and the capacitor are jointly known as a voltage buffer.

P-channel transistor 405 has source terminal coupled to the drain terminal of p-channel transistor 401. P-channel transistor 405 is a current switch. P-channel transistor 405 is driven by signal $\overline{\text{FASTER}}$ from the phase and frequency detector (PFD). When $\overline{\text{FASTER}}$ is at a low level, p-channel current switch transistor 405 conducts current. As illustrated, the current may be further divided between p-channel transistor 403 and p-channel transistor 402. Both p-channel transistor 403 and p-channel transistor 402 operate under bias voltage 324. A larger portion of current flows through p-channel transistor 403 than p-channel transistor 402, in the ratio, for example, N:1. The p-channel current switch 405 is designed to be minimum size as may be required. It may serve as a source switch for a current of magnitude (N+1). The SNR due to imperfections of switching is thus proportional to N+1. However, since N amount of current is diverted away from the output line, a smaller amount of current, one amount of current is therefore sourced to the output with a SNR proportional to N+1. Hence, an enhanced SNR proportional to N+1 for a current of value 1 is achieved. If N is 9, the SNR is improved by a factor 10.

P-channel transistor 406 is driven by signal FASTER. This transistor acts as a capacitor to couple FASTER to the source terminals of p-channel transistors 402-403. FASTER could arrive slightly earlier than FASTER. The falling edge of FASTER indicates the end of current sourcing from transistor 405. The falling edge of FASTER is thus capacitively coupled to the source nodes of p-channel transistors 402-3, temporarily lowering the voltage at the source nodes of p-channel transistors 402-3. Temporarily lowering the source voltages of p-channel transistors 402-403 helps in turning off the currents through p-channel transistors 402-403 more effectively, thereby improving the SNR performance during switching.

For the source current network, p-channel transistor 404 diverts M amount of current from p-channel transistor 401 which carries a total amount of M+N+1. Thus, p-channel transistor 401 may carrier either M amount or M+N+1 amount of current. The fact that 401 always carries some current means its channel charge is not significantly altered between current OFF and current SOURCE operations. The drain terminal of p-channel 401 is therefore not significantly perturbed between current OFF and current SOURCE operations. This configuration also improves the SNR.

The SNR in the current sink network comprising n-channel transistors 501-506 is improved in a reciprocal fashion. N-channel transistor 505 has a drain terminal coupled to the source terminals of n-channel transistors 503 and 502, both of which are operated by bias voltage 325. N-channel transistor 505 is driven by signal SLOWER from the PFD. N-channel transistor 505 acts as a current switch. When SLOWER is at a high level, n-channel current switch transistor 505 conducts current such that sink current is drawn from output line VCTL. This current may be distributed between n-channel transistor 503 and n-channel transistor 502. When the switches 405 and 505 are both off, current ICP flows from 401 to 404 into VCTL_REP, and current ICP flows from VCTL_REP through 504 and 501 to ground. The Bias voltages 323, 324, 325, 326 are set such that the currents through 401 and 501 are nominally identical and equal to ICP.

N-channel transistor 506 is driven by signal $\overline{\text{SLOWER}}$. This transistor acts as a capacitor to couple $\overline{\text{SLOWER}}$ to the source terminals of n-channel transistors 502-503. $\overline{\text{SLOWER}}$ arrives slightly earlier than $\overline{\text{SLOWER}}$. The rising edge of $\overline{\text{SLOWER}}$ indicates the end of current sinking from transistor 505. The rising edge of $\overline{\text{SLOWER}}$ is thus capacitively coupled to the source terminals of n-channel transistors 502-3, temporarily raising the voltage at the source terminals of n-channel transistors 502-3. Temporarily raising the source voltages of n-channel transistors 502-503 helps in turning off the currents through p-channel transistors 502-503 more effectively, thereby improving the SNR performance during switching.

For the sink current network, n-channel transistor 504 carries M amount of current flown from p-channel transistor 404 and output of opamp (operational amplifier) 320 to n-channel transistor 501, regardless of the conducting state of switches 505 and 405. N-channel transistor 501 is coupled to bias voltage 326. The fact that 501 always carries some current means its channel charge is not significantly altered between current OFF and current SINK operations. Hence, this configuration also improves the SNR. In some implementations, a quieter node from LPF 322 is used to set the positive (+) input to opamp 320, which also enhances the SNR performance. Here, LPF 322 represents a low-pass filter that generally removes high frequency components on the output line.

Figure 5:
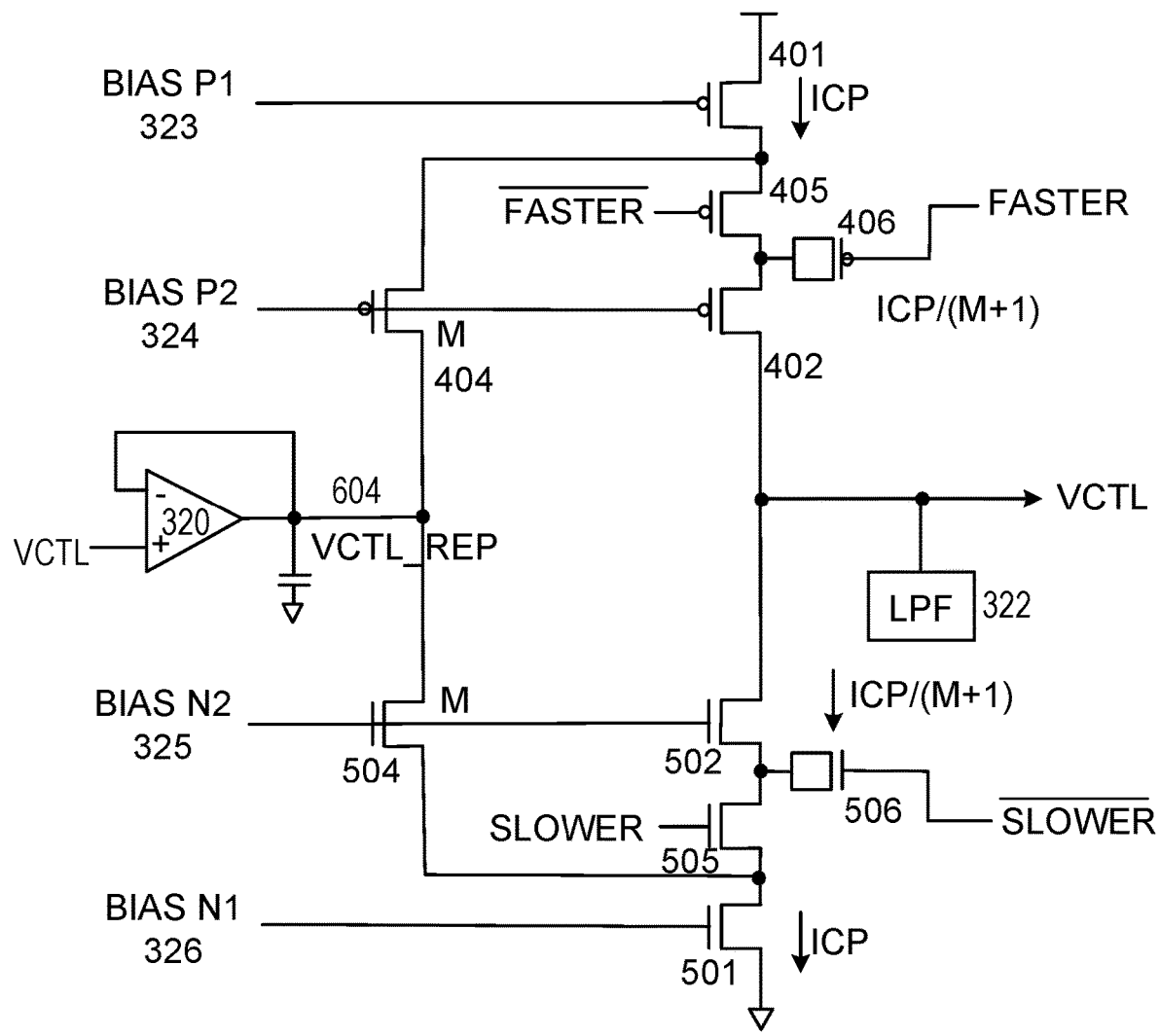
FIG. 5 illustrates another example of a charge pump device with enhanced SNR performance.

FIG. 5 illustrates another example of a charge pump device with enhanced SNR performance. In this example, p-channel transistors 401-404 act as the current source. The gate of 401 is configured to receive a p-bias input from bias voltage 323, and its drain terminal is connected to the source terminals of p-channel transistors 404 and 405. P-channel transistor 404 is operated by bias voltage 324 while p-channel transistor 405 is driven by signal $\overline{\text{FASTER}}$ from the phase and frequency detector (PFD). Here, like in FIG. 4, p-channel transistor 405 acts as a current switch. Regardless of the conducting state of p-channel switch 405, p-channel transistor 404 carries M amounts of current while p-channel switch 405 carries one amount when conducting. When $\overline{\text{FASTER}}$ is at a low level, p-channel current switch transistor 405 conducts current. P-channel transistor 406 is driven by signal FASTER. This transistor acts as a capacitor to couple FASTER to the source terminals of p-channel transistors 402, as described above.

The SNR in current sink network comprising n-channel transistors 501, 502, 504-506 is improved in a reciprocal fashion. N-channel transistor 505 has a drain terminal coupled to the source terminal of n-channel transistor 502 operated by bias voltage 325. N-channel transistor 505 is driven by signal SLOWER from the PFD. N-channel transistor 505 acts as a current switch. When SLOWER is high, n-channel current switch transistor 505 conducts current such that a sink current is drawn from output line VCTL. N-channel transistor 506 is driven by signal $\overline{\text{SLOWER}}$. This transistor acts as a capacitor to couple $\overline{\text{SLOWER}}$ to the drain terminal of n-channel transistor 502, in a manner that can facilitate turning off the currents through n-channel transistor 502 more effectively, thereby improving the SNR performance during switching, as described above.

For the sink current network, n-channel transistor 504 carries M amount of current flown from p-channel transistor 404 to n-channel transistor 501, regardless of the conducting date of switches 505 and 405 such that channel charge is not significantly altered between current OFF and current SINK operations, leading to SNR improvements. N-channel transistor 501 is operated by bias voltage 326.

Figure 6:
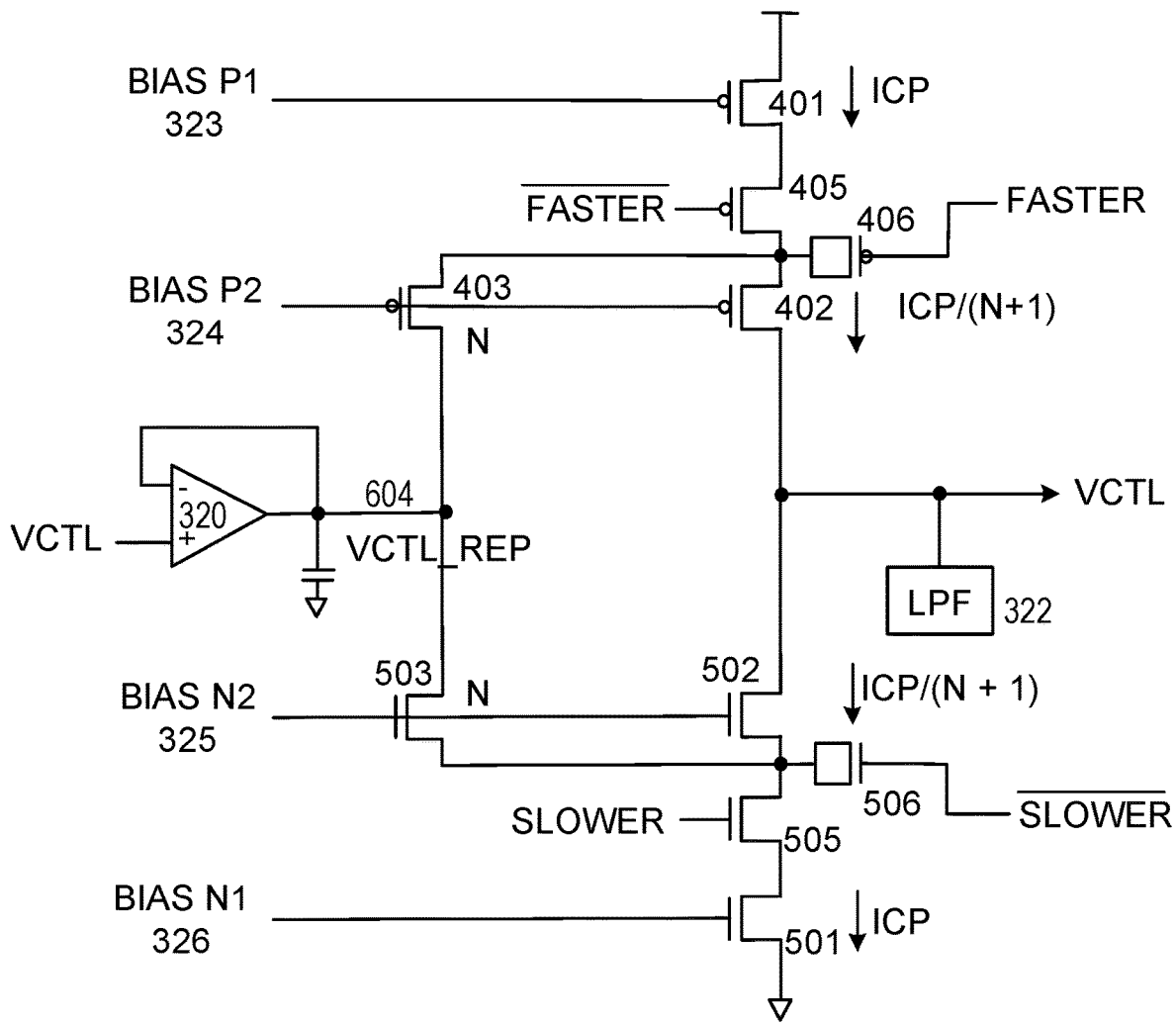
FIG. 6 illustrates yet another example of a charge pump device with enhanced SNR performance.

FIG. 6 illustrates yet another example of a charge pump device with enhanced SNR performance. In this example, the current source network includes transistors 401-403, 405-406. P-channel transistor 405 is driven by signal $\overline{\text{FASTER}}$ from the phase and frequency detector (PFD). When $\overline{\text{FASTER}}$ is at a low level, p-channel current switch transistor 405 is enabled to conduct current. As illustrated, the current may be further divided between p-channel transistor 403 and p-channel transistor 402 such that a larger portion of current flows through p-channel transistor 403 than p-channel transistor 402. The ratio may be, for example, N:1. The p-channel current switch 405 may serve as a source switch for a current of magnitude (N+1). The SNR due to imperfections of switching is thus proportional to N+1. However, since N amount of current is diverted away from the output line, a smaller amount of current, one amount of current is therefore sourced to the output with a SNR proportional to N+1. Hence, an enhanced SNR proportional to N+1 for a current of value 1 is achieved. P-channel transistor 406 is driven by signal FASTER. This transistor acts as a capacitor to couple FASTER to the source terminals of p-channel transistors 402-403 such that the voltage at the source nodes of p-channel transistors 402-3 is temporarily lowered, thereby improving the SNR performance during switching.

The SNR in current sink network comprising n-channel transistors 501-503 and 505-506 is improved in a reciprocal fashion. N-channel transistor 505 has a source terminal coupled to the drain terminals of n-channel transistors 503 and 502, both of which are operated by bias voltage 325.

N-channel transistor 505 is driven by signal SLOWER from the PFD. N-channel transistor 505 acts as a current switch. When SLOWER is at a high level, n-channel current switch transistor 505 conducts current such that a sink current is drawn from output line VCTL. N-channel transistor 506 is driven by signal $\overline{\text{SLOWER}}$. This transistor acts as a capacitor to couple $\overline{\text{SLOWER}}$ to the source terminals of n-channel transistors 502-503 such that the voltage at the source terminals of n-channel transistors 502-503 is raised temporarily. This facilitates turning off the currents through n-channel transistors 502-503 more effectively, thereby improving the SNR performance during switching.

For the sink current network, n-channel transistor 503 carries M amount of current flown from n-channel transistor 502. Both the currents from 503 and 502 flow through n-channel switch 505 to n-channel transistor 501, which is driven by bias voltage 326. The fact that 501 carries some current means its channel charge is not significantly altered between current OFF and current SINK operations. Hence, this configuration also improves the SNR.

FIG. 7A illustrates the sequencing of the FASTER, $\overline{\text{FASTER}}$, $\overline{\text{SLOWER}}$, SLOWER signals out of the PFD and running into a charge pump (CP) device. At zero phase offset between reference (REF) and feedback (FBK), that FASTER and SLOWER may have a nominally small pulse width, the pulse widths of the two signals being nominally equal, and their edges occurring at the same time. As mentioned earlier, FASTER occurs a little bit earlier $\overline{\text{FASTER}}$ and $\overline{\text{SLOWER}}$ occurs a little bit earlier than SLOWER. When the REF signal leads the FBK signal, FIG. 7B demonstrates the expansion in pulse width as well as FASTER and $\overline{\text{FASTER}}$ sequentially ahead of $\overline{\text{SLOWER}}$ and SLOWER. When the REF signal and the FBK signal are in phase, FIG. 7C shows the delay as applied to sequentially aligned FASTER and $\overline{\text{FASTER}}$, $\overline{\text{SLOWER}}$ and SLOWER. When the REF signal lags behind the FBK signal, FIG. 7D illustrates the expansion in pulse widths of $\overline{\text{SLOWER}}$ and SLOWER as well as FASTER and $\overline{\text{FASTER}}$ sequentially running behind $\overline{\text{SLOWER}}$ and SLOWER.

What has been described is a method to improve the SNR of a charge pump while driving small currents which can be employed in a high fidelity low area PLL. Indeed, a number of implementations have been described. Nevertheless, it will be understood that various modifications can be made without departing from the spirit and scope of the subject innovation. In addition, other steps may be provided, or steps may be eliminated, from the described flows, and other components may be added to, or removed from, the described systems. Accordingly, other implementations are within the scope of the following claims.

What is claimed is:

1. A method to operate a charge pump comprising a p-channel source current network that includes more than one p-channel transistors and a p-channel current switch, and a n-channel sink current network that includes more than one n-channel transistors and a n-channel current switch, the method comprising:
    receiving, at the p-channel source current network, one or more p-bias inputs;
    receiving, at the n-channel sink current network, one or more n-bias inputs;
    establishing a baseline current that flows from a first p-channel transistor of the more than one p-channel transistors in the p-channel source current network and sinks to a first n-channel transistor of the more than one n-channel transistors in the n-channel sink current network, wherein the baseline current bypasses an output line; and
    generating a voltage output on the output line by:
    in response to the p-channel current switch being activated, drawing a first increment current from the first p-channel transistor, wherein the first increment current flows (i) through the p-channel current switch to the output line of the charge pump, and (ii) in parallel with respect to the baseline current, and wherein the first increment current is smaller than the baseline current that is present continuously both before and after the p-channel current switch is activated; and
    in response to the n-channel current switch being activated, drawing a second increment current from the output line of the charge pump, wherein the second increment current flows (i) through the n-channel current switch to the first n-channel transistor, and (ii) in parallel with respect to the baseline current, and wherein the second increment current is smaller than the baseline current that is present continuously both before and after the n-channel current switch is activated.

2. The method of claim 1, further comprising:
    operating the first p-channel transistor to receive a first p-bias input;
    operating a second p-channel transistor and a third p-channel transistor, each receiving a second p-bias input;
    operating the first n-channel transistor to receive a first n-bias input; and
    operating a second n-channel transistor and a third n-channel transistor, each receiving a second n-bias input.

3. The method of claim 2, further comprising:
    operating a p-channel current switch to receive a negated first output from a phase comparator and a first output from the phase comparator.

4. The method of claim 3, wherein the first output from the phase comparator indicates whether a reference signal leads a feedback signal, and wherein the negated first output lags behind the first output from the phase comparator.

5. The method of claim 3, further comprising:
    operating the second p-channel transistor to conduct M times as much as the p-channel current switch, wherein M is larger than one.

6. The method of claim 5, further comprising:
    operating the first p-channel transistor to conduct current sufficient for the second p-channel transistor as well as the p-channel current switch when the p-channel current switch is turned on.

7. The method of claim 2, further comprising:
    operating the n-channel current switch to receive a second output from a phase comparator and a negated second output from the phase comparator.

8. The method of claim 7, wherein the second output from the phase comparator indicates whether a feedback signal leads a reference signal, and wherein the negated second output lags behind the second output from the phase comparator.

9. The method of claim 7, further comprising:
    operating the second n-channel transistor to conduct M times as much as the n-channel current switch, wherein M is larger than one.

10. The method of claim 9, further comprising:
operating the first n-channel transistor to conduct current sufficient for the second n-channel transistor as well as the n-channel current switch when the n-channel current switch is turned on.

11. The method of claim 2, further comprising:
driving a Voltage Controlled Oscillator (VCO) using the voltage output.

12. The method of claim 11, further comprising:
operating a voltage buffer disposed on a path of the baseline current and connected to the second p-channel transistor as well as the second n-channel transistor such that the voltage buffer sources and sinks currents on the path of the baseline current while generating an output voltage signal nominally equal in voltage to the voltage output.

13. A method to operate a charge pump comprising a p-channel source current network that includes more than one p-channel transistors and a p-channel current switch, and a n-channel sink current network that includes more than one n-channel transistors and a n-channel current switch, the method comprising:
receiving, at the p-channel source current network, one or more p-bias inputs;
receiving, at the n-channel sink current network, one or more n-bias inputs;
generating a voltage output on an output line by:
establishing a baseline current that flows from the p-channel source current network to the n-channel sink current network;
drawing a current, in response to the p-channel current switch being activated, from the p-channel transistors, wherein the current is incremental to the baseline current that is present continuously both before and after the p-channel current switch is activated; and
splitting the current between (i) a first path from a first p-channel transistor of the p-channel source current network to a first n-channel transistor of the n-channel sink current network and (ii) a second path through a second p-channel transistor of the p-channel source current network such that the current split to the first path is larger than the current split to the second path, wherein the current split to the first path is N times the current split to the second path, and wherein N is larger than one, and wherein the first path bypasses the output line.

14. The method of claim 13, further comprising:
operating the first p-channel transistor to receive a first p-bias input;
operating the second p-channel transistor and a third p-channel transistor, each receiving a second p-bias input;
operating the first n-channel transistor to receive a first n-bias input; and
operating a second n-channel transistor and a third n-channel transistor, each receiving a second n-bias input.

15. The method of claim 14, further comprising:
operating the p-channel current switch to receive a negated first output from a phase comparator and a first output from the phase comparator.

16. The method of claim 15, wherein the first output from the phase comparator indicates whether a reference signal leads a feedback signal, and wherein the negated first output lags behind the first output from the phase comparator.

17. The method of claim 14, further comprising:
operating the n-channel current switch to receive a second output from a phase comparator and a negated second output from the phase comparator.

18. The method of claim 17, wherein the second output from the phase comparator indicates whether a feedback signal leads a reference signal, and wherein the negated second output lags behind the second output.

19. The method of claim 14, further comprising:
operating the first p-channel transistor to conduct current sufficient for the second p-channel transistor as well as the p-channel current switch when the p-channel current switch is turned on.

20. The method of claim 14, further comprising:
operating the first n-channel transistor to conduct current sufficient for the second n-channel transistor as well as the n-channel current switch when the n-channel current switch is turned on.

* * * * *